United States Patent [19]
Twitchell et al.

[11] Patent Number: 6,081,158
[45] Date of Patent: Jun. 27, 2000

[54] ADAPTIVE PRE-DISTORTION APPARATUS FOR LINEARIZING AN AMPLIFIER OUTPUT WITHIN A DATA TRANSMISSION SYSTEM

[75] Inventors: Edwin Ray Twitchell, Quincy, Ill.; Robert C. Davis, Indialantic, Fla.

[73] Assignee: Harris Corporation, Melbourne, Fla.

[21] Appl. No.: 08/885,374

[22] Filed: Jun. 30, 1997

[51] Int. Cl.[7] .................................................. H03F 1/26
[52] U.S. Cl. .......................................... 330/149; 375/297
[58] Field of Search ..................................... 330/107, 129, 330/149; 332/103, 159, 162; 375/296, 297

[56] References Cited

U.S. PATENT DOCUMENTS

| | | | |
|---|---|---|---|
| 4,291,277 | 9/1981 | Davis et al. | 330/149 |
| 5,486,789 | 1/1996 | Palandech et al. | 330/149 |

*Primary Examiner*—Steven J. Mottola
*Attorney, Agent, or Firm*—Tarolli, Sundheim, Covell, Tummino & Szabo LLP

[57] ABSTRACT

An adaptive apparatus for compensating the non-linear distorting action of an amplifier in a transmission system. I-channel and Q-channel memories store a plurality of digital pre-distortion correction values. The memories are addressed using a predetermined number of significant bits of an incoming, original information signal to retrieve I-channel and Q-channel pre-distortion correction values. The I-channel and Q-channel pre-distortion correction values are combined, digitally, with I-channel and Q-channel components of the original information signal to pre-distort the original information signal. The pre-distorted signal, in real format, is supplied to the amplifier, and a feed-back sample signal is coupled-off of the output of the amplifier. A comparison is made between the original information signal and the feed-back sample signal in digital format and in the complex domain (I/Q). In response to the comparison, the pre-distortion correction values (I/Q) in the memory means are modified.

12 Claims, 2 Drawing Sheets ated via an analog comparison between a representation of the actual, desired data and a demodulated, "sliced" (or re-quantized) sample signal from the amplifier. The sample signal is provided for the comparison via suitable components (e.g., a quadrature demodulator) along a feed-back path.

ADAPTIVE PRE-DISTORTION APPARATUS FOR LINEARIZING AN AMPLIFIER OUTPUT WITHIN A DATA TRANSMISSION SYSTEM

TECHNICAL FIELD

The present invention relates to communication systems and is particularly directed to a system for counteracting the non-linear behavior of a high-power amplifier of a transmission system.

BACKGROUND OF THE INVENTION

A broadcast communication system employs a high-power amplifier as part of a signal transmission or transponder section of the system. Unfortunately, a high-power amplifier has non-linear distorting characteristics that cause distortion of the information signal which is amplified. The non-linear distorting characteristics of the high-power amplifier can impact the instantaneous amplitude and phase of the signal significantly. Only so much can be done to "linearize" a high-power amplifier due to cost and power dissipation.

Several known techniques are used to "pre-correct" an information signal in order to linearize the output of the amplifier. One of these techniques includes amplitude correction which produces a linear piece-wise pre-correction function which is correlated to the non-linear characteristics of the amplifier. The result is a piece-wise correction curve which approximates the ideal correction. The correction is added to the information signal.

It is also known to use an information signal to address a RAM which contains predetermined, pre-distorted versions of the information data values (see U.S. Pat. No. 4,291,277, to Davis et al). The pre-distorted version is supplied as a signal, in lieu of the actual information signal, to components (e.g., a quadrature mixer) which feed into the transmission amplifier. The substitute values in the RAM are updated via an analog comparison between a representation of the actual, desired data and a demodulated, "sliced" (or re-quantized) sample signal from the amplifier. The sample signal is provided for the comparison via suitable components (e.g., a quadrature demodulator) along a feed-back path.

However, the known system is limited by the values output by the quadrature mixer and the quadrature demodulator. For example, for a system employing a 16 QAM, quadrature demodulation of the sample signal is limited to one of four levels in each of the real (I) and imaginary (Q) axes. The known system does not have the ability to provide certain spectral corrections. Also, the analog comparison is limited by resolution of the analog signals. Specifically, the slicer of the demodulator does not provide information between sample periods (i.e., there is no useful information available). The know system cannot correct for out-of-band distortion. Thus, the know system cannot correct for the non-linearities induced by an amplifier onto a 32 bits-per-word PAM signal in an eight vestigial sideband system (8VSB). In particular, QAM is quantized to a limited set of levels in each of the I (real) and Q (imaginary) axes. In contrast, 8VSB is quantized in the I (real) axis, thus, the Q axis is infinitely variable.

SUMMARY OF THE INVENTION

The present invention provides an adaptive apparatus for compensating a distorting action to information signals by a transmission amplifier of a wide-band transmission system. The amplifier subjects the signals to shifts in signal characteristics away from their intended values. The apparatus includes data provision means for providing a multi-bit digital information signal. Memory means stores a plurality of digital pre-distortion correction values. Selection means selects a pre-distortion correction value in the memory means using a predetermined number of significant bits of the information signal as a memory address. Combiner means digitally combines the information signal and the selected pre-distortion correction value to provide a pre-distorted signal. Supply means supplies the pre-distorted signal to an input of the amplifier. Sampler means couples off a sample signal, resulting from amplification of the pre-distorted information signal, from an output of the amplifier. Comparison means compares the information signal and the sample signal in digital format. Update means modifies the selected pre-distortion value in the memory means based upon the comparison by the comparison means.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DESCRIPTION OF PREFERRED EMBODIMENT

Figure 1:
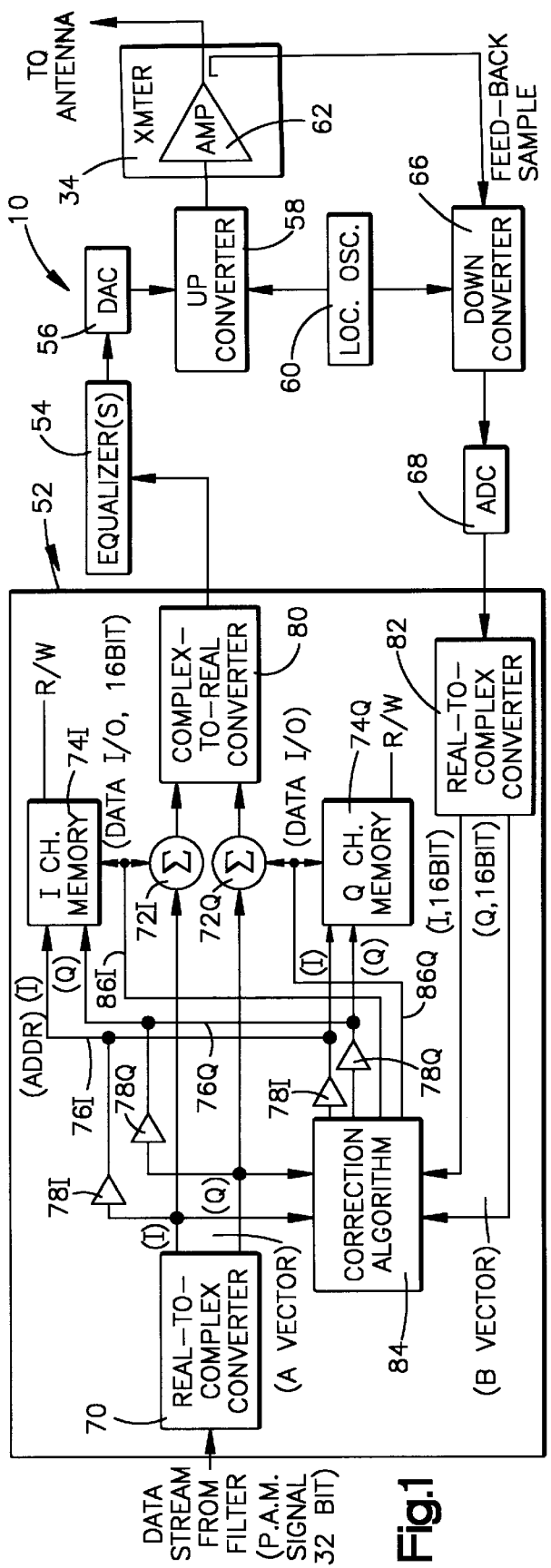
FIG. 1 is a schematic illustration of an apparatus in accordance with the present invention.

One representation of the present invention is schematically shown in FIG. 1 as an apparatus 10 which compensates for distortion of information data signals. The apparatus 10 according to the present invention provides pre-distortion correction for information data which is transmitted at a relatively high rate. Further, the present invention is useful for wide band applications (e.g., 18 MHz).

Figure 2:
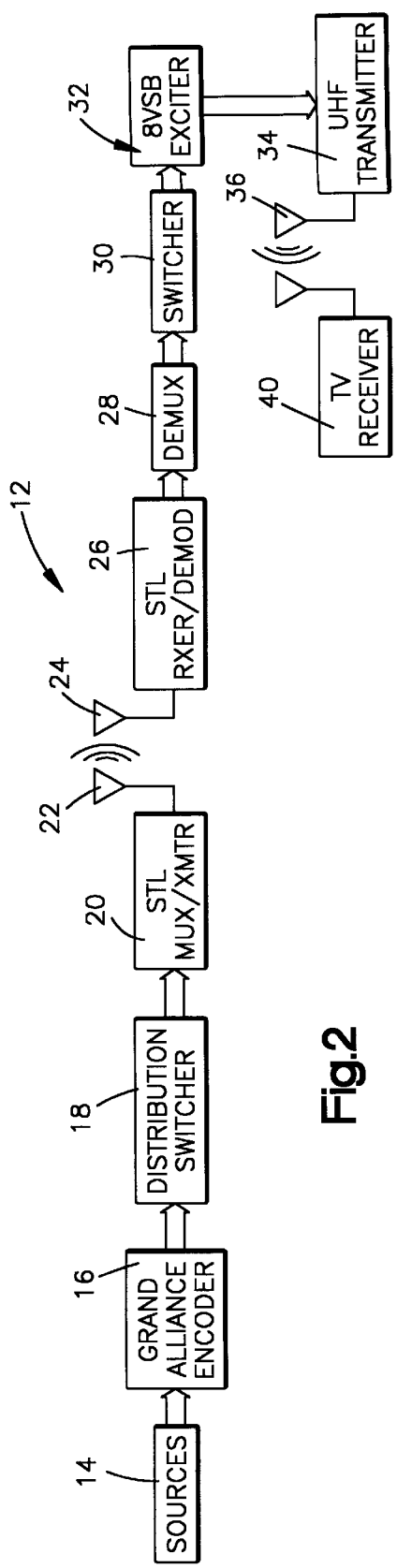
FIG. 2 is a schematic illustration of an example device in which the present invention is utilized.

The high data rate and bandwidth are related to the system environment in which the apparatus 10 is utilized. Accordingly, the apparatus 10 of the present invention may be used in any system having such demanding requirements. For example, the apparatus 10 is utilized in a high definition (HDTV) system 12, as shown in FIG. 2. The HDTV system 12 includes a plurality of sources 14, such as a camera unit, a storage unit, or a receiver unit (e.g., a satellite downlink). Signals from the sources 14 are provided to a grand alliance encoder 16. The signal from the grand alliance encoder 16 is provided to a distribution switcher 18 which provides a signal to a STL multiplexer/transmitter 20.

A microwave link is established between source and remote microwave antennas 22 and 24, and a signal from the remote antenna 24 is provided to a STL receiver/demodulator 26. The signal proceeds through a demultiplexer 28 and a switcher 30, to an eight (8) vestigial sideband (hereinafter "8VSB") exciter 32. The 8VSB exciter 32 (FIG. 3) contains the apparatus 10 in accordance with the present invention. The output of the 8VSB exciter 32 (FIG. 2) is provided to a UHF/VHF transmitter 34, and a broadcast signal from a broadcast antenna 36 is received at a television 40. It will be appreciated by a person of ordinary skill in the art that signal timing lines, which supply appropriate timing signal, to various components of the system (including components of the apparatus 10) are needed for synchronizing operation of the various components. The person of ordinary skill in the art will understand the timing operation. Accordingly, the timing lines are omitted for clarity.

Figure 3:
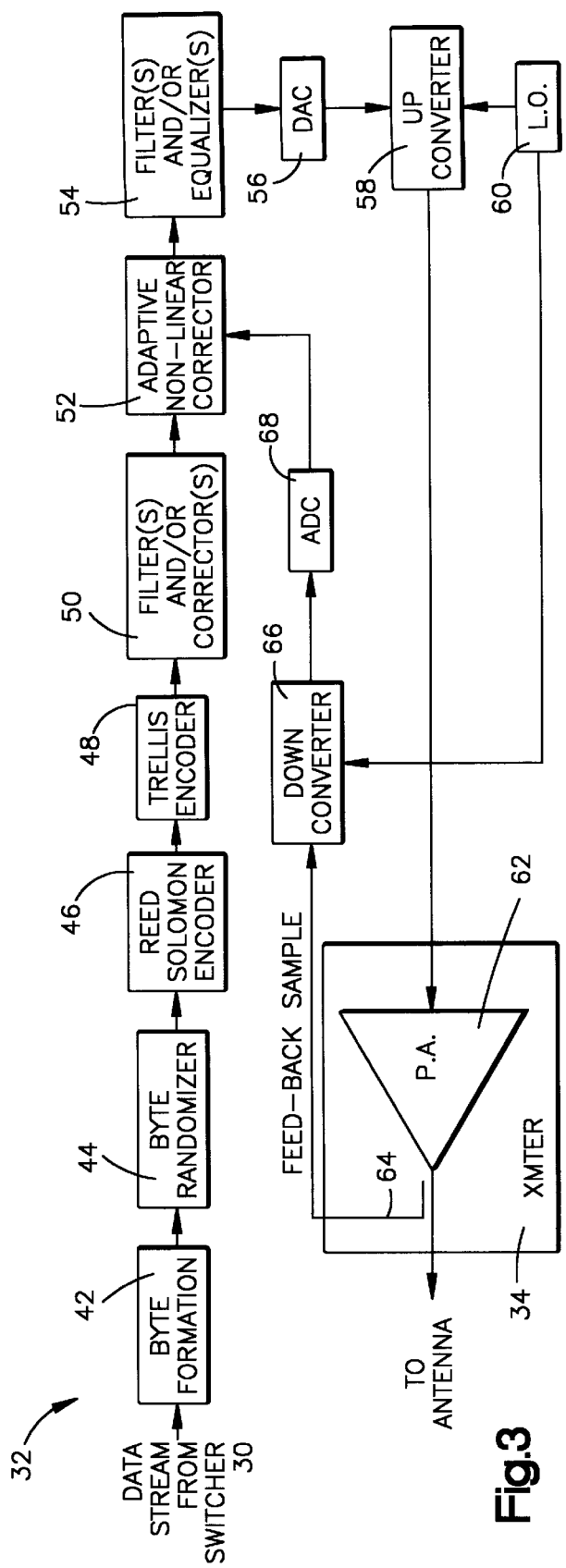
FIG. 3 is a schematic illustration of a portion of the device shown in FIG. 2 which contains the apparatus of the present invention.

Turning now to the details of the example 8VSB exciter 32 shown within FIG. 3, the information data stream is received from the switcher 30 and proceeds to a byte formation device 42 and then to a byte randomizer device 44. The information data stream proceeds through a Reed Solomon encoder 46 and through a Trellis encoder 48. The information data stream proceeds through one or more filters and/or correctors 50, an adaptive non-linear corrector 52, and one or more filters and/or equalizers 54. In the preferred embodiment, the information data stream input to the non-linear corrector 52 is comprised of 32-bit words defined within a phase-amplitude modulated electrical signal. The non-linear corrector 52 is part of the apparatus 10 which compensates for non-linear distortion of the information signal, and is described in greater detail below.

The information data stream proceeds through a digital-to-analog converter (DAC) 56 and an up converter 58, which is driven by a local oscillator 60. The information data stream proceeds from the up converter 58 toward the transmitter 34. Within the transmitter 34, the information data stream (now analog and up-converted) is passed through a high-power transmission amplifier 62 of the transmitter 34. The amplifier 62 distorts the signal passing through the amplifier in a non-linear fashion.

Figure 4:
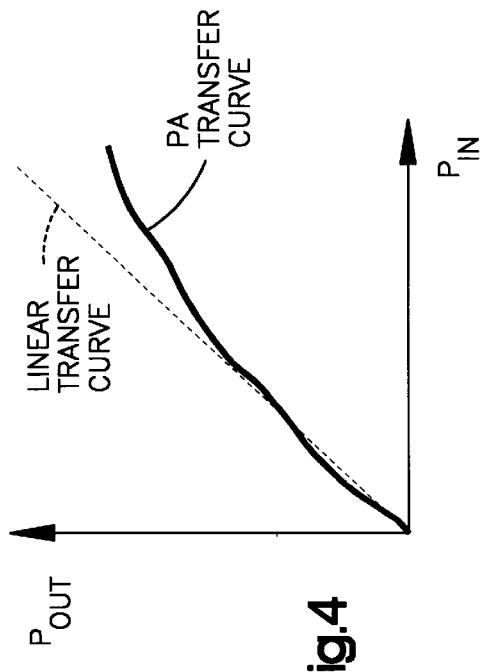
FIG. 4 is a plot of an amplifier transfer curve.

For example, FIG. 4 is a plot of a transfer function (i.e., input vs. output) of a high-power amplifier. An actual transfer curve of the amplifier is shown by a solid line in FIG. 4. A linear transfer curve, which is typically an ideal that is not achievable, is shown by the dot line of FIG. 4. The plot shows the deviation of the actual transfer from the ideal as the input increases.

As part of the process of compensating for the non-linear distortion caused by the amplifier 62, the output of the amplifier 62 is "sampled" to provide a feed-back sample signal. The feed-back sample signal is indicative of the amplifier output and is provided along a feed-back path. Specifically, a coupler 64 couples off the sample signal from the output of the amplifier 62. The feed-back sample signal passes through a down converter 66, which is driven by the same local oscillator 60 as the up converter 58. The feed-back sample signal passes through an analog-to-digital converter (ADC) 68 and is provided to the non-linear corrector 52.

Within the non-linear corrector 52 (FIG. 1), in order to compensate for the non-linear distortion caused by the amplifier 62, the information signal (i.e., the source data signal, which is hereinafter referred to as the original information signal) is pre-distorted. Specifically, the desired output from the amplifier, upon amplification of the pre-distorted signal, is a signal which would occur if the amplifier 62 did not cause distortion. Further, as the distortion properties of the amplifier 62 change (e.g., change due to temperature fluctuation, and change due to aging of components), the non-linear corrector 52 adapts the pre-distortion to compensate for the new distortion from the amplifier 62.

In the non-linear corrector 52, the original information signal is provided to a real-to-complex converter 70. It should be appreciated that if the original information signal is supplied to the non-linear corrector 52 in complex format (I,Q), the real-to-complex converter 70 is not needed. For example, a real-to-complex conversion of the original information signal may occur upstream of at least one of the filters/correctors 50, which operates in complex rather than real. For purposes of discussion is this specification and not limitation, the data stream supplied to the non-linear corrector 52 is real and the real-to-complex converter 70 is present.

The output of the real-to-complex converter 70 is an I-channel signal, which is representative of the real component, and a Q-channel signal, which is representative of the imaginary component. In the preferred embodiment, the I-channel original information signal contains 16 bits per word (i.e., one-"half" of the original 32 bit word), and the Q-channel original information signal contains 16 bits per word (i.e., the other "half" of the original 32 bit word).

The I-channel original information signal is supplied as a first input to an I-channel summation device 72I and the Q-channel original information signal is supplied as a first input to a Q-channel summation device 72Q. A second input to the I-channel summation device 72I is provided from an I-channel random access memory 74I. Similarly, a second input to the Q-channel summation device 72Q is provided by a Q-channel random access memory 74Q. Within each of the summation devices 72I, 72Q, the two supplied inputs are added.

The values provided by the I-channel and Q-channel memories 74I and 74Q to the summation devices 72I, 72Q are pre-distortion correction values. Each of the I-channel and Q-channel memories contain an array of memory locations, which are in the form of look-up tables. Each memory location contains a correction value word, which has a size corresponding to the I/Q original information signal word size. Accordingly, in the preferred embodiment, each word within the I-channel and Q-channel memories has 16 bits.

Preferably, the array size (i.e, number of memory locations) of the I-channel memory 74I is identical to the size of the Q-channel memory 74Q. The array size of the I-channel and Q-channel memories 74I and 74Q is related to the number of bits of each information data word which are designated as "most significant". Specifically, the size of each of the I-channel and Q-channel memories 74I, 74Q is $2^{k1} \times 2^{k2}$, wherein k1 is a number of designated most significant bits of the I-channel original information signal and k2 is a number of designated most significant bits of the Q-channel original information signal. In the preferred embodiment, for each channel (I and Q) eight bits (of the 16 total bits) are designated most significant. Thus, preferably, the memory arrays (I and Q) each have $2^8 \times 2^8$ (65,536) memory locations, and the size of each memory (I and Q) is $(2^8 \times 2^8)*16$.

The correction values in the I-channel memory 74I are accessed and supplied to the second input of the I-channel summation device 72I by utilizing the k-most significant bits of the I-channel original information signal word, plus the k-most significant bits of the Q-channel original information signal word as an address. The k-most significant bits of the I-channel original information signal word are provided on an address bus 76I through a buffer connection 78I (e.g., appropriate tri-state buffer interconnections). The k-most significant bits of the Q-channel original information signal word are provided on an address bus 76Q through a buffer connection 78Q (e.g., appropriate tri-state buffer interconnections). Within the I-channel memory 74I, the k-most significant bits of the I-channel original information signal is used as the k-most significant bits of the memory address and the k-most significant bits of the Q-channel original information signal is used as the k-least significant bits of the memory address. It will be appreciated that the accessing the I-channel memory 74I is controlled via an address bus buffer controller, which is omitted for clarity, and a read/write control line.

Similarly, the correction values in the Q-channel memory 74Q are accessed and supplied to the second input of the Q-channel summation device 72Q by utilizing the k-most significant bits of the I-channel original information signal word, plus the k-most significant bits of the Q-channel original information signal word as an address. Within the Q-channel memory 74Q, the k-most significant bits of the I-channel original information signal is used as the k-most significant bits of the memory address and the k-most significant bits of the Q-channel original information signal is used as the k-least significant bits of the memory address. It will be appreciated that the accessing the Q-channel memory 74Q is controlled via an address bus buffer controller, which is omitted for clarity, and a read/write control line.

The addition of the correction value provided by the memory 74I to the I-channel original information signal (via the summation device 72I) results in a pre-distorted, I-channel information signal. The addition of the correction value provided by the memory 74Q to the Q-channel original information signal (via the summation device 72Q) results in a pre-distorted, Q-channel information signal. It is to be appreciated that the present invention provided for, not only correction of signal amplitude distortion, but also correction of instantaneous phase distortion caused by the amplifier 62. Accordingly, the values in the memories have complex factors which are accessed by use of the Q-channel original information signal as part of the memory address.

The pre-distorted I-channel and Q-channel signals are output from the summation devices 72I and 72Q, respectively. The pre-distorted I-channel and Q-channel signals are provided to a complex-to-real converter 80. The converter 80 combines the I-channel and Q-channels, and outputs a pre-distorted information signal, in real format. The output of the complex-to-real converter 80 is provided to the digital-to-analog converter 56 to proceed downstream, through the up converter 58 to the transmitter 34 with its amplifier 62. The pre-distorted information signal output from the complex-to-real converter 80 is such that the non-linear distortion, caused by the amplifier 62, is compensated.

Adaption to the changing non-linear distorting characteristics of the amplifier 62 is accomplished via provision of the feed-back sample signal (i.e., the pre-distorted, distorted signal output from the analog-to-digital converter 68) to the non-linear corrector 52. Within the corrector 52, the feed-back sample signal is input to a real-to-complex converter 82. The output of the real-to-complex converter 82 is an I-channel feed-back sample signal and a Q-channel feed-back sample signal. The I-channel and Q-channel feed-back sample signals represent the pre-distorted, amplifier-distorted original information signal in the complex domain. In the preferred embodiment, the I-channel and Q-channel feed-back sample signals comprise 16 bit words.

A correction algorithm 84 adapts or adjusts the amount of pre-distortion which the non-linear corrector 52 imposes upon a subsequent information data signal. The I-channel and Q-channel original information signals, which are output from the real-to-complex converter 70, are provided as a first input to the correction algorithm 84. The I-channel and Q-channel feed-back sample signals, which are output from the real-to-complex converter 82, are provided as a second input to a correction algorithm 84. Within the correction algorithm 84, the I-channel original information signal is compared with a corresponding I-channel feed-back sample signal to determine a difference. Preferably, one of the two compared I-channel signals is subtracted from the other. Similarly, the Q-channel original information signal is compared with a corresponding Q-channel feed-back sample signal to determine a difference. Scaling of the I-channel and the Q-channel original information signals takes place, if necessary, within the correction algorithm 84 to accommodate system gain variations.

It is to be appreciated that because the non-linear corrector 52 is a component within a data stream system, subsequent, "original" information data continues to move through the system and must be processed. Also, the feed-back sample signal which corresponds to a particular original information signal is "created" when that original information signal passes through the amplifier 62 (i.e., coupled off of the output of the amplifier). The feed-back sample signal is created at a time later than the provision of the corresponding original information signal to the correction algorithm 84. Further, the corresponding feed-back sample signal must proceed and be processed through several components to reach the correction algorithm 84. Accordingly, the correction algorithm 84 includes buffer memory means (not shown) for holding each the I-channel and Q-channel original information signals for a short duration until they are matched for comparison with the corresponding I-channel and Q-channel feed-back sample signals. The original information signals (I and Q) are held in the buffer memory awaiting the completion of the activity regarding provision of the corresponding feed-back sample signals (I and Q) to the correction algorithm 84 (again, timing signals, necessary to correlate and synchronize, are omitted for clarity).

Figure 5:
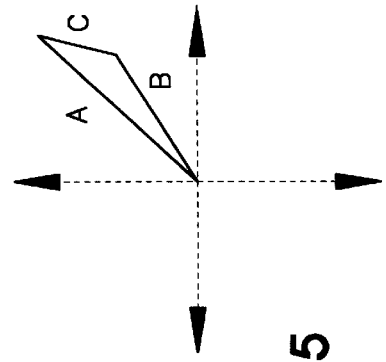
FIG. 5 is a complex vector plot illustrating the pre-distortion correction of the present invention.

Focusing now on the comparison between the corresponding signals within the correction algorithm 84. The differences, if any, between the original information signals (I and Q) and the feed-back return sample signals (I and Q) represent the proportional amount that the original information signal should have been pre-distorted in order to fully compensate for the distortion which occurred within the amplifier 62. This can be understood by identifying the original information signal as an "A" vector (FIG. 5) in a complex plane and identifying the feed-back sample signal as a "B" vector in the complex plane. The difference between the A and B vectors is a "C" vector. The "C" vector represents the error vector which identifies the direction and relative magnitude of the correction needed.

The correction algorithm 84 generates a new I-channel correction value and a new Q-channel correction value for adjustment of the values in the I-channel and Q-channel memories 74I and 74Q, accordingly. If necessary, the new I-channel and Q-channel values are scaled. The new correction values are supplied by the correction algorithm 84 to input lines 86I, 86Q of the I-channel and Q-channel memories 74I and 74Q, respectively. Simultaneously, the correction algorithm 84 provides an eight bit address for each of the I-channel and Q-channel memories to be applied to the address bus lines 76I and 76Q, respectively. The memory addresses provided by the corrected algorithm are derived from the original I-channel and Q-channel signals stored within the buffer memory of the correction algorithm 84.

It is to be appreciated that when the distorting characteristics of the amplifier 62 change, the correction algorithm 84 will successively refine the correction values within the I-channel and Q-channel memories 74I and 74Q each time an identical original information signal proceeds through the data stream. In other word, the process is iterative or empirical. The amount of correction (i.e., the vector C, FIG. 5) which the correction algorithm 84 generates will become smaller and smaller as the correction progresses toward ideal pre-distortion correction values. Further, each time the distorting characteristics of the amplifier 62 change, the adaptive non-linear corrector 52, with its correction algorithm 84, adapts to the new distortion.

Accordingly, the present invention provides finer transfer curve control and adaptation to system changes (e.g., drift). Further, inter-symbol levels created by pulse shaping and/or system bandwidth limiting are corrected. Specifically, inter-sample levels are accommodated via a sample rate greater than the symbol rate.

From the above description of the invention, those skilled in the art will perceive improvements, changes and modifications. For example, the memories may be PROMs which have their values updated via reprogramming from the correction algorithm. Also, the separate memories for each channel can be replaced with a single memory containing all of the correction values. Such improvements, changes and modifications within the skill of the art are intended to be covered by the appended claims.

Having described the invention, the following is claimed:

1. An adaptive apparatus for compensating a distorting action to information signals by a transmission amplifier of a wide band transmission system, the amplifier subjecting the signals to shifts in signal characteristics away from their intended values, said apparatus comprising:

signal provision means for providing a multi-bit digital information signal having a number of bits;

memory means for storing a plurality of digital pre-distortion correction values;

selection means for selecting a pre-distortion correction value in said memory means using a predetermined number of significant bits of the information signal as a memory address, said predetermined number of significant bits being less than the total bits;

combiner means for digitally combining the information signal and the selected pre-distortion correction value to provide a pre-distorted signal;

supply means for supplying the pre-distorted signal to an input of the amplifier;

sampler means for coupling off a sample signal, resulting from amplification of the pre-distortion of the information signal, from an output of the amplifier;

comparison means for comparing the information signal and the sample signal in digital format; and update means for modifying the selected pre-distortion correction value in said memory means based upon the comparison by said comparison means.

2. An apparatus as set forth in claim 1, wherein said signal provision means includes means for providing the information signal in I-channel and Q-channel format.

3. An apparatus as set forth in claim 2, wherein said memory means includes means for storing I-channel and Q-channel components of the pre-distortion correction values.

4. An apparatus as set forth in claim 3, wherein said combiner means including means for combining I-channel components and means for combining Q-channel components.

5. An apparatus as set forth in claim 4, wherein said supply means includes a complex-to-real converter, a digital-to-analog converter, and an up converter.

6. An apparatus as set forth in claim 1, wherein said comparison means includes means for determining the difference between the information signal and the sample signal.

7. An apparatus as set forth in claim 6, wherein said update means includes means for modifying the selected pre-distortion correction value to include the difference between the information signal and the sample signal.

8. An apparatus as set forth in claim 1, wherein the information signal has a 32 bit word, said selection means using 16 significant bits of the information signal word as a memory address.

9. An adaptive apparatus for compensating a distorting action to information signals by a transmission amplifier of a wide band transmission system, the amplifier subjecting the signals to shifts in signal characteristics away from their intended values, said apparatus comprising:

signal provision means for providing a multi-bit digital information signal;

memory means for storing a plurality of digital pre-distortion correction values;

selection means for selecting a pre-distortion correction value in said memory means using a predetermined number of significant bits of the information signal as a memory address;

combiner means for digitally combining the information signal and the selected pre-distortion correction value to provide a pre-distorted signal;

supply means for supplying the pre-distorted signal to an input of the amplifier;

sampler means for coupling off a sample signal, resulting from amplification of the pre-distortion of the information signal, from an output of the amplifier;

comparison means for comparing the information signal and the sample signal in digital format; and update means for modifying the selected pre-distortion correction value in said memory means based upon the comparison by said comparison means;

said memory means including means for storing I-channel and Q-channel components of the pre-distortion correction values, and said selection means including means for selecting an I-channel component of a pre-distortion correction value using an I-channel component and a Q-channel component of the information signal as a memory address and means for selecting a Q-channel component of a pre-distortion correction value using an I-channel component and a Q-channel component of the information signal as a memory address.

10. An apparatus as set forth in claim 9, wherein the I-channel component of the information signal has a 16 bit word and the Q-channel component of the information signal has a 16 bit word, and said selection means uses eight significant bits of the I-channel component of the information signal as a memory address and said selection means uses eight significant bits of the Q-channel component of the information signal as a memory address.

11. An apparatus as set forth in claim 9, wherein said means for storing I-channel components of the pre-distortion correction values has an array size for storing $2^{k1} \times 2^{k2}$ pre-distortion correction values, and k1 is the number of significant bits of the I-channel component of the information signal used as a memory address and k2 is the number of significant bits of the Q-channel component of the information signal used as a memory address.

12. An apparatus as set forth in claim 11, wherein said means for storing Q-channel components of the pre-distortion correction values has an array size for storing $2^{k1} \times 2^{k2}$ pre-distortion correction values, and k1 is the number of significant bits of the I-channel component of the information signal used as a memory address and k2 is the number of significant bits of the Q-channel component of the information signal used as a memory address.

* * * * *